(12) United States Patent
Jeong et al.

(10) Patent No.: US 9,184,349 B2
(45) Date of Patent: Nov. 10, 2015

(54) LIGHT EMITTING DEVICE, ADHESIVE HAVING SURFACE ROUGHNESS, AND LIGHTING SYSTEM HAVING THE SAME

(71) Applicant: LG INNOTEK CO., LTD., Seoul (KR)

(72) Inventors: Ji Eun Jeong, Seoul (KR); Da Eun Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 26 days.

(21) Appl. No.: 14/071,119

(22) Filed: Nov. 4, 2013

(65) Prior Publication Data

US 2014/0124820 A1    May 8, 2014

(30) Foreign Application Priority Data

Nov. 5, 2012    (KR) .................. 10-2012-0124302

(51) Int. Cl.

| | |
|---|---|
| *H01L 27/15* | (2006.01) |
| *H01L 29/267* | (2006.01) |
| *H01L 31/12* | (2006.01) |
| *H01L 33/00* | (2010.01) |
| *H01L 31/0203* | (2014.01) |
| *H01L 23/48* | (2006.01) |
| *H01L 23/52* | (2006.01) |
| *H01L 29/40* | (2006.01) |
| *H01L 33/44* | (2010.01) |
| *H01L 33/54* | (2010.01) |
| *H01L 33/62* | (2010.01) |
| *H01L 23/00* | (2006.01) |
| *H01L 21/673* | (2006.01) |
| *H01L 33/22* | (2010.01) |
| *H01L 33/48* | (2010.01) |

(52) U.S. Cl.

CPC .............. *H01L 33/44* (2013.01); *H01L 24/97* (2013.01); *H01L 33/54* (2013.01); *H01L 33/62* (2013.01); *H01L 21/6733* (2013.01); *H01L 21/67316* (2013.01); *H01L 21/67366* (2013.01); *H01L 33/22* (2013.01); *H01L 33/486* (2013.01); *H01L 2224/48247* (2013.01); *H01L 2924/12041* (2013.01); *H01L 2924/3025* (2013.01)

(58) Field of Classification Search

CPC ............... H01L 2924/00; H01L 2924/12041; H01L 2924/3025; H01L 2224/48247; H01L 24/97; H01L 33/00; H01L 33/22; H01L 33/36; H01L 33/38; H01L 33/44; H01L 33/48; H01L 33/483; H01L 33/486; H01L 33/52; H01L 33/54; H01L 33/62; H01L 21/56; H01L 21/565; H01L 21/67316; H01L 21/6733; H01L 21/67366; H01L 28/84; H01L 29/30

USPC ................ 257/79, 81, 98, 99, 100, 433, 753, 257/E23.127, E21.584

See application file for complete search history.

(56) References Cited

U.S. PATENT DOCUMENTS

2004/0046242 A1 *  3/2004  Asakawa ...................... 257/678
2005/0139851 A1 *  6/2005  Sato ............................... 257/99

(Continued)

*Primary Examiner* — Teresa M Arroyo
(74) *Attorney, Agent, or Firm* — Birch, Stewart, Kolasch & Birch, LLP

(57) ABSTRACT

Disclosed is a light emitting device. The light emitting device includes a body having a cavity; first and second lead frames spaced apart from each other in the cavity, a gap part between the first and second lead frames, an adhesive material extending from at least one of sidewalls of the cavity to a top surface of at least one of the first and second lead frames, a light emitting chip on at least one of the first and second lead frames, and a molding member adhering to the adhesive material in the cavity.

20 Claims, 7 Drawing Sheets

(56) References Cited

U.S. PATENT DOCUMENTS

| | | | |
|---|---|---|---|
| 2005/0173708 A1* | 8/2005 | Suehiro et al. | 257/79 |
| 2007/0012940 A1* | 1/2007 | Suh et al. | 257/99 |
| 2008/0037252 A1* | 2/2008 | Nii et al. | 362/267 |
| 2008/0296607 A1* | 12/2008 | Nall et al. | 257/100 |
| 2009/0134414 A1* | 5/2009 | Li et al. | 257/98 |
| 2012/0267661 A1* | 10/2012 | Kim et al. | 257/98 |
| 2013/0049061 A1* | 2/2013 | Takeda et al. | 257/99 |
| 2013/0126927 A1* | 5/2013 | Iguchi | 257/98 |
| 2014/0225145 A1* | 8/2014 | Masuda et al. | 257/98 |
| 2015/0001563 A1* | 1/2015 | Miki | 257/98 |

* cited by examiner

LIGHT EMITTING DEVICE, ADHESIVE HAVING SURFACE ROUGHNESS, AND LIGHTING SYSTEM HAVING THE SAME

CROSS-REFERENCE TO RELATED APPLICATIONS

The present application claims priority under 35 U.S.C. §119(a) of Korean Patent Application No. 10-2012-0124302 filed on Nov. 5, 2012, which is hereby incorporated by reference in its entirety.

BACKGROUND

The embodiment relates to a light emitting device and a lighting system having the same.

A light emitting diode (LED) is one of a light emitting device that converts electric energy to light. In comparison with other light sources such as a fluorescent lamp and an incandescent lamp, the LED is advantageous because of low power consumption, a long lifetime, a fast response time, safety, and environment-friendliness. Accordingly, many studies and researches to substitute the existing light sources with the light emitting diode have been carried out. In addition, the light emitting diodes are increasingly used as light sources of a variety of lamps used in indoor and outdoor places and lighting devices such as liquid crystal displays, electronic display boards, and streetlamps.

SUMMARY

The embodiment provides a light emitting device having a novel structure.

The embodiment provides a light emitting device capable of reducing the distribution of an adhesive material on the bottom surface of a cavity.

According to the embodiment, there is provided a light emitting device including a body having a cavity, first and second lead frames spaced apart from each other in the cavity, a gap part between the first and second lead frames, an adhesive material extending from at least one of sidewalls of the cavity to a top surface of at least one of the first and second lead frames, a light emitting chip on at least one of the first and second lead frames, and a molding member adhering to the adhesive material in the cavity.

DETAILED DESCRIPTION OF THE EMBODIMENTS

Figure 1:
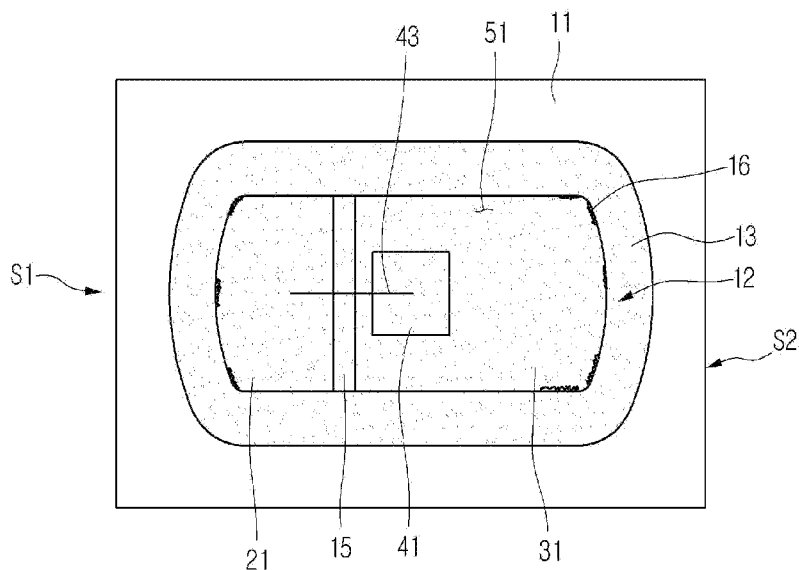
FIG. 1 is a plan view showing a light emitting device according to the first embodiment.

In the description of the embodiments, it will be understood that, when a layer (film), a region, a pattern, or a structure is referred to as being "on" a substrate, another layer (film), another region, or another structure, it can be "directly" or "indirectly" on the other substrate, the other layer (film), the other region, or the other structure, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Hereinafter, a light emitting device according to the first embodiment will be described with reference to accompanying drawings.

Figure 2:
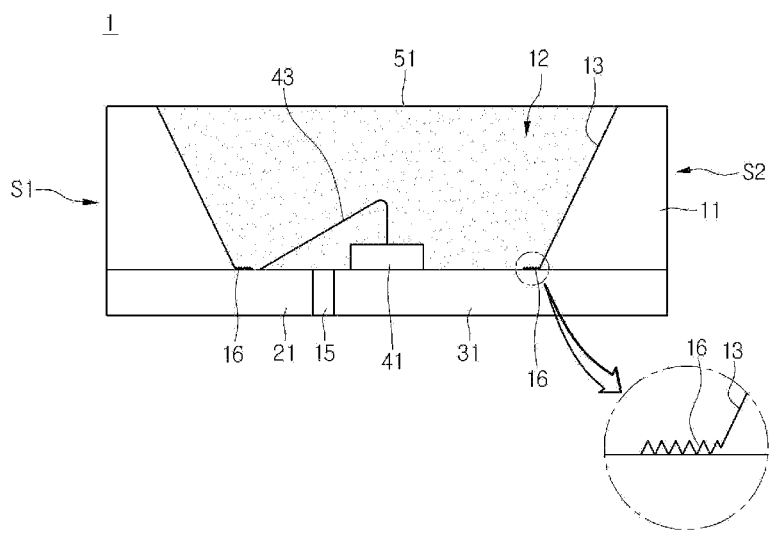
FIG. 2 is a side sectional view showing the light emitting device of FIG. 1.

FIG. 1 is a plan view showing a light emitting device according to the first embodiment. FIG. 2 is a side sectional view showing the light emitting device of FIG. 1.

Referring to FIGS. 1 and 2, a light emitting device 1 includes a body 11 having a cavity 12, a gap part 15, an adhesive material 16, first and second lead frames 21 and 31, a light emitting chip 41, and a molding member 51.

The body 11 may include a material representing transmittance higher than reflectance with respect to a wavelength emitted by the light emitting chip 41. For example, the body 11 may include at least 70% of reflectance. If the body 11 represents at least 70% of reflectance, a material constituting the body 11 may include a non-transmittive material. The body 11 may include a resin-based insulating material. For example, the body 11 may include a resin material such as polyphthalamide (PPA). The body 11 may include thermosetting resin including a silicon-based material, an epoxy-based material, or a plastic material, or a high heat resistance material, or a high light resistance material. The silicon includes white-color-based resin. In addition, the body 11 may selectively include acid anhydride, an antioxidant, a release agent, an optical reflector, an inorganic filling agent, a curing catalyst, a light stabilizer, a lubricant, or a titanium dioxide. The body 11 may be molded by using at least one selected from the group consisting of epoxy resin, modified epoxy resin, silicon resin, modified silicon resin, acrylic resin, and urethane resin. For instance, the body 11 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU(1.8-Diazabicyclo(5,4,0)undecene-7) serving as a hardening accelerator and ethylene glycol, titanium oxide pigment or glass fiber serving as a promoter to the epoxy resin, but the embodiment is not limited thereto.

In addition, a light shielding material or a dispersing agent is added in the body 11 to reduce light transmitted through the body 11. In addition, the body 11 may include at least one selected from the group consisting of a dispersing agent, pigments, phosphors, reflective materials, light shielding materials, a light stabilizer, and a lubricant mixed with thermal setting resin.

The body 11 may include a metallic oxide added to a resin material such as epoxy or silicon. The metallic oxide may include at least one of $TiO_2$, $SiO_2$, and $Al_2O_3$. The metallic oxide may be added in the body 11 with the content of at least 3 wt %. Accordingly, the body 11 may effectively reflect incident light. In this case, if the content of the metallic oxide added in the body 11 is 3 wt % or less, the reflection efficiency may be degraded. If the reflection efficiency is degraded, the light orientation distribution may be changed.

Alternatively, the body 11 may include a resin material representing transmittance or a resin material having a phosphor to convert the wavelength of incident light.

A cathode mark may be formed on the body 11. The cathode mark may distinguish between the first and second lead frames 21 and 31 to prevent the polarities of the first and second lead frames 21 and 31 from being confused with each other.

The cavity 12 is disposed in the body 11, and the cavity 12 may be formed in a concave shape or a cup shape recessed from the top surface of the body 11. The cavity 12 may have a circular shape, an oval shape, and a polygonal shape when viewed from a device top, but the embodiment is not limited thereto. The first and second lead frames 21 and 31 are provided on the bottom surface of the cavity 12.

A lateral side 13 of the cavity 12 may be formed in a curved surface and/or an angular surface, and may be perpendicular to the bottom surface of the cavity 12 or inclined with respect to the bottom surface of the cavity 12.

The first and second lead frames 21 and 31 are provided on the bottom surface of the cavity 12, and the gap part 15 is disposed between the first and second lead frames 21 and 31. The first lead frame 21 extends from the gap part 15 to the lower portion of a first lateral side S1 of the body 11. The second lead frame 32 extends from the gap part 15 to the lower portion of a second lateral side S2 of the body 11.

The first and second lead frames 21 and 31 may be provided on the bottom surface of the cavity 12. The first and second lead frames 21 and 31 may be located at a lower position than a line extending from the bottom surface of the cavity 12. The first and second lead frames 21 and 31 may have a flat frame shape, but the embodiment is not limited thereto.

The first and second lead frames 21 and 31 may include metallic plates having a predetermined thickness, and another metallic layer may be plated on the surface of the metallic plate, but the embodiment is not limited thereto. The first and second lead frames 21 and 31 may include a metallic material, for example, at least one of titanium (Ti), copper (Cu), nickel (Ni), gold (Au), chrome (Cr), tantalum (Pt), zinc (Sn), silver (Ag), and phosphorous (P). In addition, the first and second lead frames 21 and 31 may be formed in multi-layer structures, but the embodiment is not limited thereto. The thicknesses of the first and second lead frames 21 and 31 are in the range of 0.25 mm to 1.5 mm, for example, may be in the range of 0.3 mm to 0.8 mm.

The gap part 15 is disposed between the first and second lead frames 21 and 31 to physically separate the first lead frame 21 from the second lead frame 31. The gap part 14 may include the same material as that constituting the body 11. The bottom surface of the body 11, the bottom surface of the gap part 14, and the bottom surfaces of the first and second lead frames 21 and 31 may be provided on the same plane, but the embodiment is not limited thereto.

The light emitting chip 41 is provided on at least one of the first and second lead frames 21 and 31 provided on the bottom surface of the cavity 12. The light emitting chip 41 may be realized by using a diode to emit light in a visible band, such as red light, green light, blue light, or white light, or light in an ultra violet band, but the embodiment is not limited thereto.

As shown in drawings, the light emitting chip 41 is mounted on the second lead frame 31, and electrically connected with the second lead frame 31. The light emitting chip 41 is connected with the first lead frame 21 through a connection member 43. The connection member 43 includes a wire.

The light emitting chip 41 may be realized in the form of a lateral type chip in which two electrodes are provided in parallel, and a vertical chip in which two electrodes are provided at opposite lateral sides, but the embodiment is not limited thereto. The lateral type chip may be connected with at least two wires, and the vertical chip may be connected with at least one wire. In addition, the light emitting chip 41 may be mounted in a flip scheme, but the embodiment is not limited thereto.

The molding member 51 is formed in the cavity 12. The molding member 51 may include a transmissive resin material such as epoxy or silicon. In addition, the molding member 51 may selectively include phosphor and/or a dispersing agent, but the embodiment is not limited thereto. The phosphors may include a YAG-based phosphorous material, a silicate-based material, or a TAG-based phosphorous material. An optical lens may be formed on the molding member 51. The optical lens may include a concave lens, a convex lens, or a lens having a portion, which is concave, and a remaining portion which is convex.

An adhesive material 16 is applied to the top surfaces of the first and second lead frames 21 and 31 provided on the bottom surface of the cavity 12 while extending from the lateral side 13 of the cavity 12. The adhesive material 16 may be applied to portions of the top surfaces of the first and second lead frames 21 and 31, but the embodiment is not limited thereto.

The adhesive material 16 may include an insulating material different from materials constituting the first and second lead frames 21 and 31, and may include a material constituting the body 11. For example, the adhesive material 16 may include an epoxy material. The adhesive material 16 may include a metallic material including at least one of $TiO_2$, $SiO_2$, and $Al_2O_3$. The surficial color of the adhesive material 16 may be the same color as that of the body 11. For example, the surficial color of the adhesive material 16 may include a white color or another color.

The adhesive material 16 may be formed on a region of the bottom surface of the cavity 12 adjacent to the lateral side 13 of the cavity 12, and may be formed along the boundary surface between the lateral side 13 of the cavity 12 and the first and second lead frames 21 and 31. The adhesive material 16 may be provided on one region or a plurality of regions of the first and second lead frames 21 and 31. The adhesive material 16 is more distributed on the circumferential portion of the cavity 12 as compared with a region of the bottom surface of the cavity 12 adjacent to the light emitting chip 41.

Adhesive materials 16 have irregular shapes and are spaced apart from each other. The adhesive materials 16 adhere to the surfaces of the first and second lead frames 21 and 31 to prevent moisture from being infiltrated into the first and second lead frames 21 and 31, and improve the adhesive strength with the molding member 51. However, since the surface luminosity of the first and second lead frames 21 and 31 may be varied, the minimum amount of the adhesive material 16 is distributed at a region wherein an influence is less exerted on the surface luminosity.

In addition, the adhesive material 16 may be more distributed at the corners of the cavity 12, but the embodiment is not limited thereto. The adhesive material 16 has predetermined surface roughness, and the surface roughness may be 0.1 μm or more, for example, in the range of 0.116 μm to 0.290 μm.

If the surface roughness of the adhesive material 16 is 0.290 μm or more, the surface luminosity of the first and second lead frames 21 and 31 may be degraded. The thickness of the adhesive material 16 is thinner than that of the light emitting chip 41, and may be 5 μm or less, for example, in the range of 0.001 μm to 3 μm.

FIGS. 3 to 11 are sectional views showing the fabricating process of the light emitting device of FIG. 2.

Figure 3:
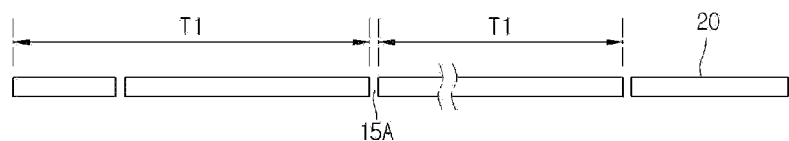
FIGS. 3 to 10 are sectional views showing the fabricating process of the light emitting device of FIG. 2.
Figure 4:
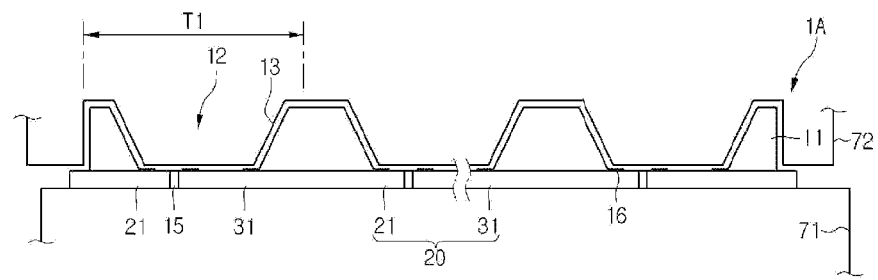

Referring to FIGS. 3 and 4, a plurality of gap regions 15A are provided in a disc-shape lead frame 20. Each gap region 15A is provided corresponding to the gap part of each light emitting device. In other words, the gap region 15A is disposed between the first and second lead frames 21 and 31.

After providing the lead frame 20 on the base plate 71, a mold frame 72 is coupled with the lead frame 20. Thereafter, a liquid-phase body material is injected between the base plate 71 and the injection mold 72. Accordingly, the body 11 is molded on the lead frame 20. The body 11 is provided therein with the cavity 12, and the first and second lead frames 21 and 31 and the gap part 15 are provided on the bottom surface of the cavity 12. The adhesive material 16 is provided on the bottom surface of the cavity 12. The adhesive material 16 may include the material the same as that constituting the body 11, and may be located at the circumferential portion of the cavity 12 and at the region of the bottom surface of the cavity 12 adjacent to the gap part 15.

The adhesive material 16 may be provided at the thickness of 1 μm or less on the first and second lead frames 21 and 31 provided on the bottom surface of the cavity 12. Accordingly, if the adhesive material 16 is distributed in a wide area, the surface luminosity on the bottom surface of the cavity 12 may be degraded.

Figure 5:
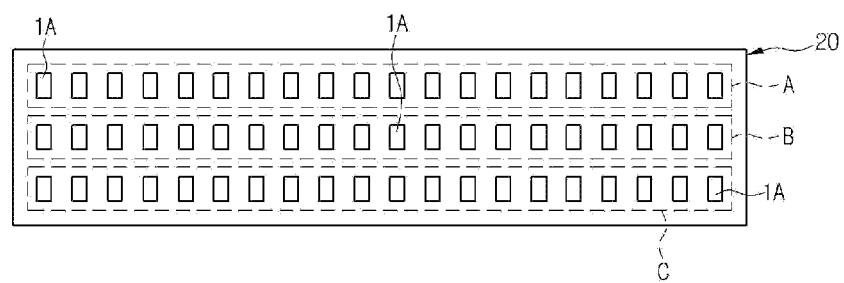
Figure 6:
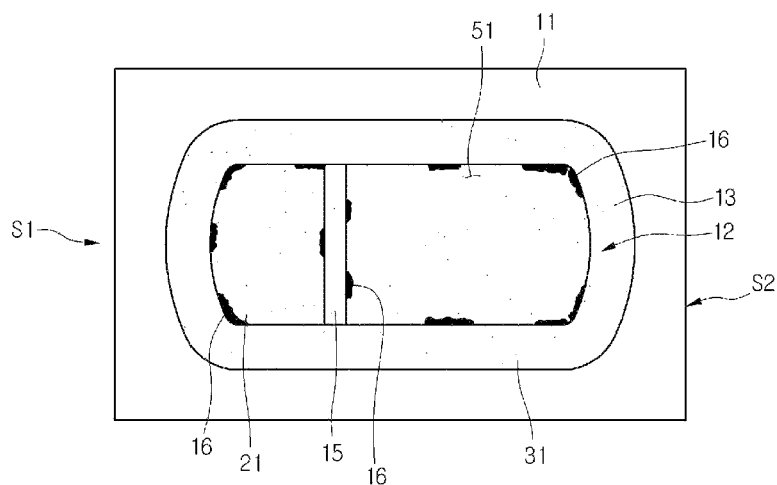
Figure 7:
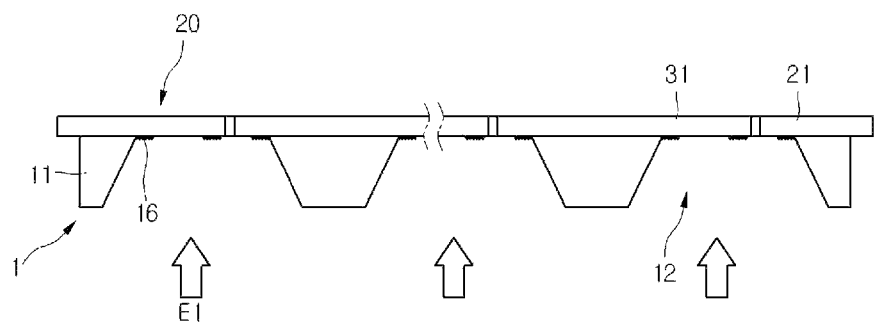

As shown in FIGS. 5 to 7, a light emitting module, in which light emitting regions 1A are arranged in plural rows A, B, and C, is provided. The adhesive materials 16 are distributed on different regions of the bottom surfaces of cavities 12. Then, a process of removing the adhesive materials 16 is performed.

A portion of the adhesive material 16 is expanded or laminated from the lead frame 20 by supplying current to the light emitting module. Thereafter, a process E1 of spraying water to the light emitting device region 1A is performed to remove the adhesive material 16.

In this case, as shown in FIG. 7, after directing the light emitting device region 1A downward by rotating the light emitting module, the adhesive material 16 may be partially removed by spraying the water.

Figure 8:
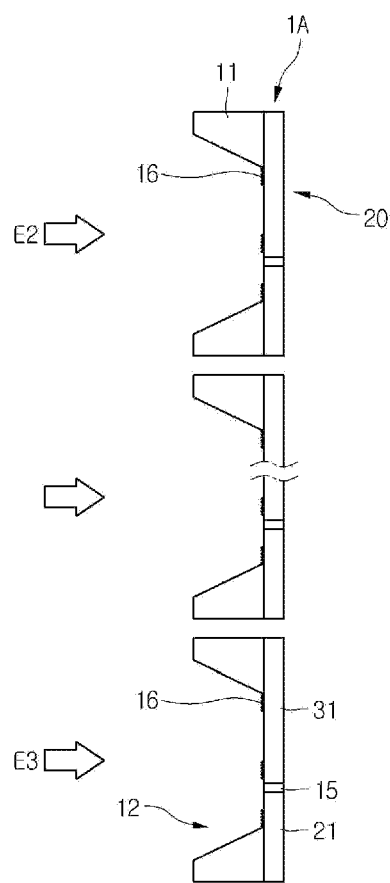

Alternately, as shown in FIG. 8, after vertically arranging the light emitting module, processes E2 and E3 of horizontally spraying water to the light emitting device regions 1A at different water pressures are performed. Therefore, the adhesive material 16 adhering to the bottom surface of the cavity 12 of the light emitting device region 1A is partially removed from the bottom surface of the cavity 12. In this case, the adhesive material 16 may be partially removed from the entire portions of the upper/lower regions of the light emitting module by spraying water to the light emitting module at a water pressure which is increased downward.

The adhesive material 16 may be partially removed by spraying water to the light emitting module at different water pressures with a time difference. Alternatively, the distribution of the adhesive material 16 may be reduced from the entire portion of the light emitting module after rotating the light emitting module.

The degradation of the surface luminosity of the first and second lead frames 21 and 31 caused by the adhesive material 16 may be improved by reducing the distribution region of the adhesive material 16 through the water spraying process.

Figure 9:
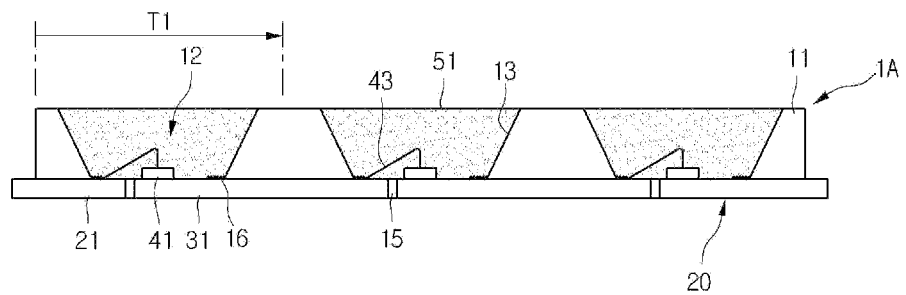

Referring to FIG. 9, a chip mounting process of mounting the light emitting chip 41 on the second lead frame 31 provided on the bottom surface of the cavity 12 and connecting the light emitting chip 41 with the first lead frame 21 through the connection member 43 is performed. After the light emitting chip 41 is mounted, the molding member 51 is formed in the cavity 12.

Figure 10:
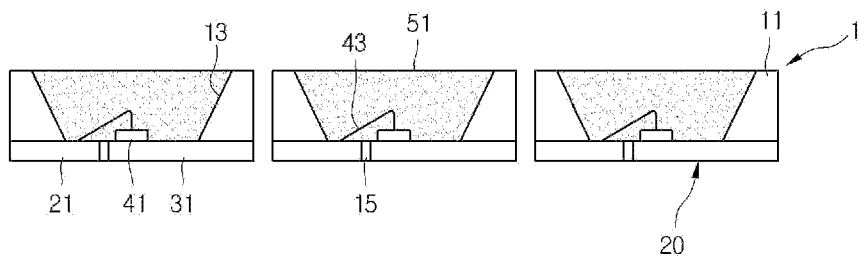
Figure 11:
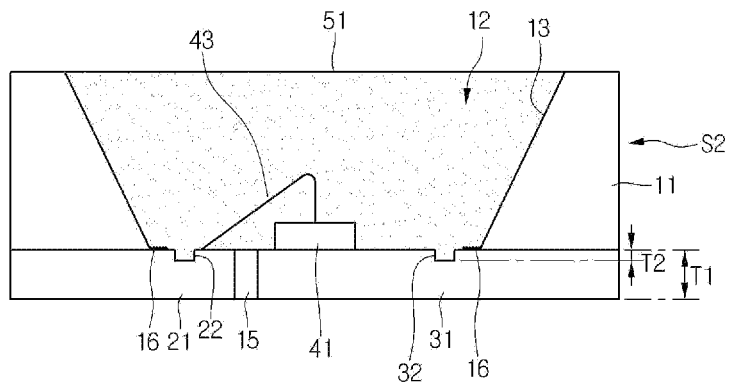
FIG. 11 is a side sectional view showing a light emitting device according to the second embodiment.

Referring to FIGS. 9 and 10, an individual light emitting device is cut out of the light emitting module in individual light emitting device size, so that the individual light emitting device shown in FIG. 11 may be provided. In this case, the adhesive material 16 extending from the lateral side 13 of the cavity 12 to top surfaces of the first and second lead frames 21 and 31 remains in the light emitting device.

The light emitting device chip 41 is provided on the second lead frame 31 arranged on the bottom surface of the cavity 12 and connected with the first lead frame 21 through the connection member 43.

The molding member 51 is formed in the cavity 12. The molding member 51 may be formed through a dispensing scheme or a squeeze scheme. The molding member 51 may include a transmissive material, and may have phosphors contained therein. An optical lens may be additionally formed on the molding member 51, but the embodiment is not limited thereto.

Then, a cutting process is performed in an individual device unit so that the light emitting device shown in FIG. 2 may be fabricated.

Referring to FIG. 11, the light emitting device includes the body 11 having the cavity 12, the gap part 15, the adhesive material 16, the first and second lead frames 21 and 31 having grooves 22 and 32, the light emitting chip 41, and the molding member 51.

The first lead frame 21 has the first groove 22 that is provided at a region adjacent to the lateral side 13 of the cavity 12 rather than the light emitting chip 41. The first groove 22 is provided along the lateral side 13 of the cavity 12, and spaced apart from the lateral side 13 of the cavity 12 by a predetermined interval.

The second lead frame 31 has the second groove 32 that is adjacent to the lateral side 13 of the cavity 12 rather than the light emitting chip 41. The second groove 32 is provided along the lateral side 13 of the cavity 12 and spaced apart from the lateral side 13 of the cavity 12 by a predetermined interval.

The depths T2 of the first and second grooves 22 and 32 may be formed to 50% or less based on the thicknesses T1 of the first and second lead frames 21 and 31. The lengths of the first and second grooves 22 and 32 may be longer than the width of the bottom surface of the cavity 12.

The adhesive material 16 may extend from the lateral side 13 of the cavity 12. The adhesive material 16 may be provided between the first groove 22 and the lateral side 13 and between the second groove 32 and the lateral side 13.

A portion of the molding member 51 may be filled in the first and second grooves 22 and 32 to prevent the adhesive material 16 from being infiltrated into the first and second grooves 22 and 32. Accordingly, a bonding portion of the connection member 43 may be prevented from being detached due to the adhesive material 16.

The light emitting device according to the embodiment may be applied to a lighting system. The lighting system has a structure in which a plurality of light emitting devices are arrayed. The lighting system may include a display device shown in FIGS. 12 and 13, a lighting device shown in FIG. 14, a lighting lamp, a signal lamp, a headlight of a vehicle, or an electric signboard.

Figure 12:
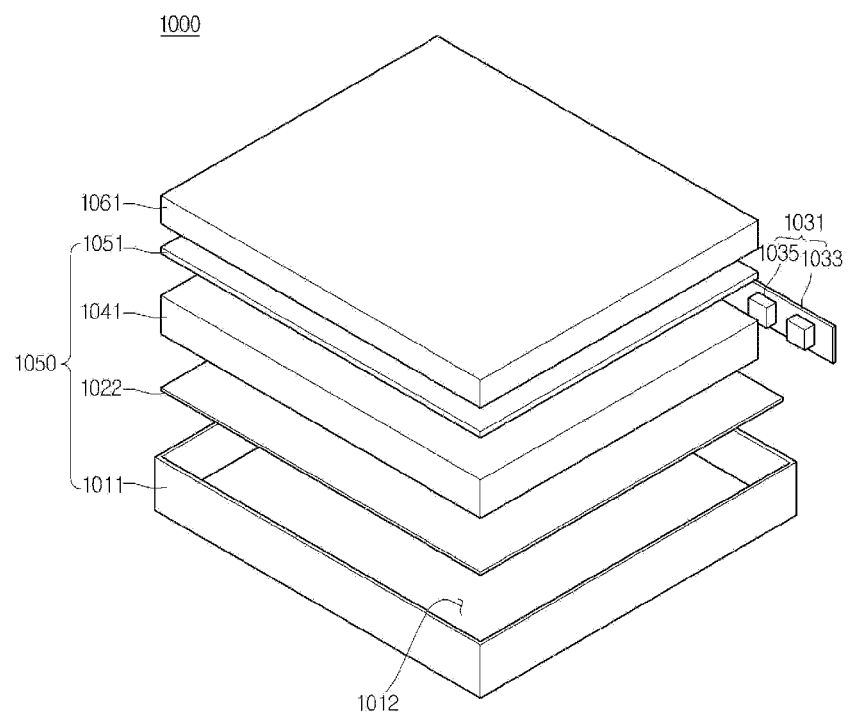
FIG. 12 is a perspective view showing one example of a display device according to the embodiment.

FIG. 12 is an exploded perspective view showing a display device having the light emitting device according to the embodiment.

Referring to FIG. 12, a display device 1000 according to the embodiment may include a light guide plate 1041, a light emitting module 1031 to supply the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed in at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting devices 1035 according to the embodiments. The light emitting devices 1035 are arrayed on the substrate 1033 while being spaced apart from each other by the predetermined interval.

The substrate 1033 may include a printed circuit board (PCB) including a circuit pattern (not shown). In addition, the substrate 1033 may include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the substrate 1033 may be omitted. The heat dissipation plate partially makes contact with the top surface of the bottom cover 1011.

In addition, the light emitting devices 1035 are arranged on the substrate 1033 such that a light exit surface of the light emitting devices 1035 is spaced apart from the light guide plate 1041 by a predetermined interval, but the embodiment is not limited thereto. The light emitting devices 1035 may directly or indirectly supply the light to a light incident surface, which is one side of the light guide plate 1041, but the embodiment is not limited thereto.

The reflective member 1022 may be provided below the light guide plate 1041. The reflective member 1022 reflects the light, which travels downward through the bottom surface of the light guide plate 1041, upward, thereby improving the brightness of a light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving part 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other and include a transparent material, and a liquid crystal layer disposed between the first and second substrates. A polarizing plate can be attached to at least one surface of the display panel 1061, but the embodiment is not limited thereto. The display panel 1061 displays information by a light passing through an optical sheet 1051. The display apparatus 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel, and the brightness enhanced sheet improves the brightness by reusing the lost light. In addition, a protective sheet may be provided on the display panel 1061, but the embodiment is not limited thereto.

The light guide plate 1041 and the optical sheet 1051 can be provided on the light path of the light emitting module 1031 as optical members, but the embodiment is not limited thereto.

Figure 13:
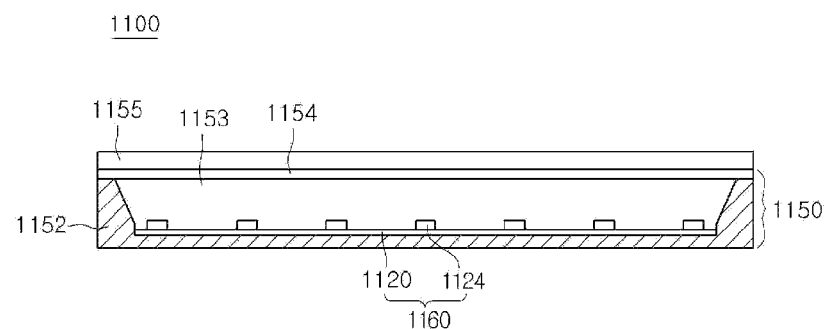
FIG. 13 is a perspective view showing another example of the display device according to the embodiment.

FIG. 13 is a view showing the display device having the light emitting device according to the embodiment.

Referring to FIG. 13, the display apparatus 1100 includes a bottom cover 1152, a substrate 1120 on which the light emitting devices 1124 are arrayed, an optical member 1154, and a display panel 1155.

The substrate 1120 and the light emitting device 1124 may constitute the light emitting module 1160. In addition, the bottom cover 1152, at least one light emitting module 1160, and the optical member 1154 may constitute the light unit 1150. The bottom cover 11152 may include a receiving part 1153, but the embodiment is not limited thereto. The light emitting module 1160 includes the substrate 1120 and a plurality of light emitting devices 1124 arranged on the substrate 1120.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate may be omitted. The diffusion sheet diffuses the incident light, the horizontal and vertical prism sheet concentrates the incident light onto the display panel, and the brightness enhanced sheet improves the brightness by reusing the lost light.

The optical member 1154 is provided on the light source module 1160. The optical member 1154 provides the light emitted from the light source module 1150 as a surface light source, or diffuses or concentrates the light.

Figure 14:
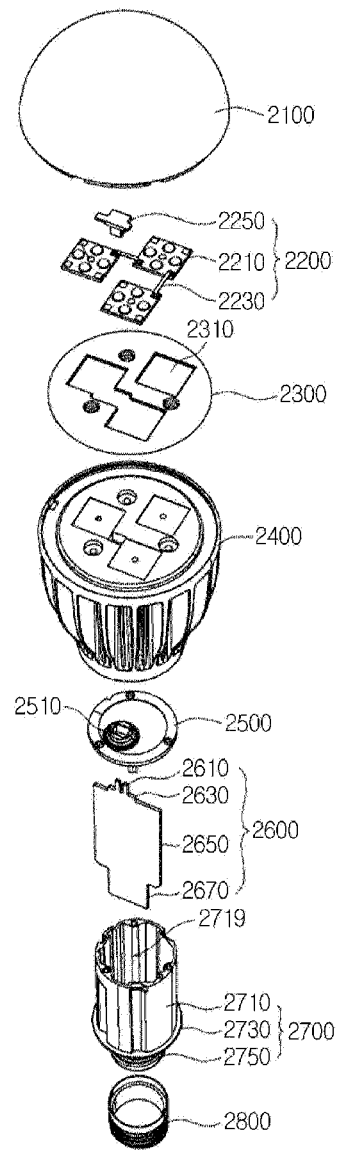
FIG. 14 is a view showing a lighting device according to the embodiment.

FIG. 14 is an exploded perspective view showing a lighting device having the light emitting device according to the embodiment.

Referring to FIG. 14, the lighting system according to the embodiment may include a cover 2100, a light source module 2200, a radiator 2400, a power supply part 2600, an inner case 2700, and a socket 2800. The lighting device according to the embodiment may further include at least one of a member 2300 and a holder 2500. The light source module 2200 may include the light emitting device according to the embodiment.

For example, the cover 2100 may have a bulb shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting device according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives and radiates heats from the light source module 2200 and the power supply part 2600.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in a receiving groove 2719 of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+electric wire" and a "−electric wire" are electrically connected to the extension part 2670 and second terminals of the "+electric wire" and the "−electric wire" may be electrically connected to the socket 2800.

The inner case 2700 may include a molding part therein together with the power supply part 2600. The molding part is prepared by hardening molding liquid, and the power supply part 2600 may be fixed inside the inner case 2700 by the molding part.

As described above, the embodiment can improve the surface luminosity provided on the bottom surface of the cavity. The embodiment can improve the product yield of the light emitting device. The embodiment can improve the reliability of the light emitting chip. The embodiment can improve the reliability of the light emitting device and the light unit having the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body having a cavity;
first and second lead frames spaced apart from each other in the cavity;
a gap part disposed between the first and second lead frames;
an adhesive material extending from at least one of lateral sides of the cavity to a top surface of at least one of the first and second lead frames;
a light emitting chip disposed on at least one of the first and second lead frames; and a molding member adhering to the adhesive material in the cavity, wherein a portion of the adhesive material has a surface roughness in a range of 0.116 μm to 0.290 μm.

2. The light emitting device of claim 1, wherein the adhesive material comprises a material the same as a material constituting the body.

3. The light emitting device of claim 2, wherein the adhesive material extends from mutually different lateral sides of the cavity onto the first and second lead frames.

4. The light emitting device of claim 1, wherein the adhesive material is located closer to at least one lateral side of the cavity than to a lateral surface of the light emitting chip.

5. The light emitting device of claim 1, wherein the adhesive material comprises an epoxy material.

6. The light emitting device of claim 5, wherein the adhesive material comprises a metallic oxide.

7. The light emitting device of claim 1, wherein the first and second lead frames are located at a lower position than a line extending from a bottom surface of the cavity.

8. The light emitting device of claim 1, wherein the first and second lead frames comprise a groove located closer to the lateral side of the cavity than to a lateral surface of the light emitting chip, and the adhesive material is disposed between the lateral side of the cavity and the groove.

9. The light emitting device of claim 1, wherein the adhesive material directly contacts the top surface of at least one of the first and second lead frames in the cavity and protrudes from a surface of the body, and wherein the adhesive material is formed of an insulating material.

10. A light emitting device comprising:
a body having a cavity;
first and second lead frames spaced apart from each other in the cavity;
a gap part disposed between the first and second lead frames;
a plurality of adhesive structures extending from at least one of lateral sides of the cavity to a top surface of at least one of the first and second lead frames;
a light emitting chip disposed on at least one of the first and second lead frames; and
a molding member adhering to the adhesive structure structures in the cavity, wherein the plurality of adhesive are provided at regions different from each other, and a portion of the adhesive structures has surface roughness in a range of 0.116 μm to 0.290 μm.

11. The light emitting device of claim 10, wherein the adhesive structures comprise a material the same as a material constituting the molding member.

12. The light emitting device of claim 10, wherein the adhesive structures comprise a material the same as a material constituting the body.

13. The light emitting device of claim 10, wherein the adhesive structures protrude from all lateral sides of the cavity.

14. The light emitting device of claim 10, wherein at least one of the adhesive structures protrudes from the gap part.

15. The light emitting device of claim 10, wherein a material filling the gap part and the body comprise materials the same as a material constituting the adhesive structures.

16. The light emitting device of claim 15, wherein the body comprises an epoxy material.

17. The light emitting device of claim 15, wherein the first and second lead frames comprise a groove located closer to the lateral side of the cavity than to the light emitting chip, and the adhesive structures are disposed between the lateral side of the cavity and the groove.

18. The light emitting device of claim 17, wherein the groove has a depth less than thicknesses of the first and second lead frames, and a portion of the molding member makes contact with an inner portion of the groove.

19. The light emitting device of claim 17, wherein the groove comprises a plurality of grooves adjacent to opposite lateral sides of the cavity.

20. The light emitting device of claim 10, wherein the plurality of adhesive structures are disposed on different regions of top surfaces of the first and second lead frames in the cavity.

* * * * *